United States Patent [19]
Ohbuchi

[11] Patent Number: 5,922,134
[45] Date of Patent: Jul. 13, 1999

[54] SIMULTANEOUS DISCHARGE DEVICE

[75] Inventor: Kazuto Ohbuchi, Kanagawa, Japan

[73] Assignee: Tokyo Ohka Kogyo Co., Ltd., Kanagawa, Japan

[21] Appl. No.: 08/856,254

[22] Filed: May 14, 1997

[30] Foreign Application Priority Data

May 14, 1996 [JP] Japan ................................. 8-118681

[51] Int. Cl.⁶ .............................................. C23C 16/00
[52] U.S. Cl. ............................. 118/723 ER; 118/723 E; 156/345
[58] Field of Search ................... 118/723 E, 723 ER, 118/723 I, 723 IR, 723 AN, 723 R; 156/345; 204/298.08, 298.34; 315/111.21, 111.51, 111.71

[56] References Cited

U.S. PATENT DOCUMENTS

| | | | |
|---|---|---|---|
| 5,534,070 | 7/1996 | Okamura et al. | 118/723 E |
| 5,540,781 | 7/1996 | Yamagami et al. | 118/723 E |
| 5,558,751 | 9/1996 | Mahler et al. | 204/298.26 |
| 5,611,899 | 3/1997 | Maass | 204/298.08 |
| 5,643,364 | 7/1997 | Zhao et al. | 118/723 E |
| 5,753,320 | 5/1998 | Mikoshiba et al. | 427/752 |

FOREIGN PATENT DOCUMENTS 63-260033  10/1988  Japan.

*Primary Examiner*—Bruce Breneman
*Assistant Examiner*—Luz Alejandro
*Attorney, Agent, or Firm*—Carrier, Blackman & Associates, P.C.; Joseph P. Carrier; William D. Blackman

[57] ABSTRACT

In a simultaneous discharge device for discharging inside of two chambers 4, 14 simultaneously by a single high-frequency power supply P, electric power dividing means 20 connects high-frequency power supply P to two chambers 4, 14, wherein electric power dividing means 20 comprises a first conductor plate 21 which connects the respective electrodes of the two chambers 4,14, a second conductor plate 23 which connects to the end of Rf cables 22 in said high-frequency power supply P and a conductor bar 24 which connects electrically the first and second conductor plates at a plurality of positions so that an impedance between the power supply and each of the chambers becomes equal.

13 Claims, 3 Drawing Sheets

SIMULTANEOUS DISCHARGE DEVICE

BACKGROUND OF THE INVENTION

1. Field of the Invention

The present invention relates to a simultaneous discharge device for etching or ashing a coat formed on the surface of a material to be treated such as a semiconductor wafer or the like through discharging inside two chambers simultaneously with one high-frequency power supply.

2. Description of the Relevant Art

There is already known a simultaneous discharge device for discharging inside two chambers simultaneously with one high-frequency power supply which connects first respective ends of two Rf cables 101 to output terminals of a high-frequency power supply 100 and connects the other ends thereof to first plate-like electrodes 104, 105 in two chambers 102, 103, as shown in FIG. 5. Then, second plate-like electrodes 106, 107 are connected to ground.

According to the known device, although a single discharge does not make a wide difference in the rate of etching or ashing, simultaneous discharging inside of the two chambers by one high-frequency power supply does make a wide difference because there is some difference in impedance between the chambers 102 and 103 and the current tends to flow toward the chamber having the lower impedance. This is a problem.

This difference in impedance is caused by inherent differences in the arrangement of the first plate-like electrodes 104 and 105, the second plate-like electrodes 106 and 107, the Rf cables 101 and so on.

SUMMARY OF THE INVENTION

In order to solve the above-mentioned problem, according to the present invention, there is provided a simultaneous discharge device for etching or ashing a coat formed on the surface of a material to be treated such as a semiconductor wafer or the like in each of two chambers at the same rate through discharging inside two chambers simultaneously with one high-frequency power supply, wherein the high-frequency power supply is connected to the two chambers via electric power dividing means.

As a result of correcting the difference in impedance between the respective chambers with the electric power dividing means that supplies the same power to each chamber, it is possible to etch or ash a coat formed on the surface of a material to be treated such as a semiconductor wafer or the like in the respective chambers at the same rate.

The above-mentioned electric power dividing means comprises a first conductor plate connected to the respective electrodes of said two chambers, a second conductor plate connected to a power supply via output cables in a high-frequency power supply; and a conductor bar which connects said first conductor plate and said second conductor plate at a plurality of positions.

Further, a plurality of connecting holes may be formed, which fit and connect said conductor bar to said first and second conductor plates. There may be, for example, nine holes formed, or there may be, for example, a single oblong hole formed.

As a result of connecting the first and second conductor plates by fitting the conductor bar to any suitable connecting holes, it is possible to correct any inherent differences in impedance between the respective chambers easily and rapidly.

DESCRIPTION OF THE PREFERRED EMBODIMENT(S)

Hereinafter, an explanation will be given in more detail about the presently preferred embodiments according to the present invention, by referring to the attached drawings. In this invention, a conducting material such as copper, aluminum or the like may be used as a conductor plate 21, a conductor plate 23 or as a conductor bar 24. However, the following explanation will be given using, as an example, copper.

Figure 1:
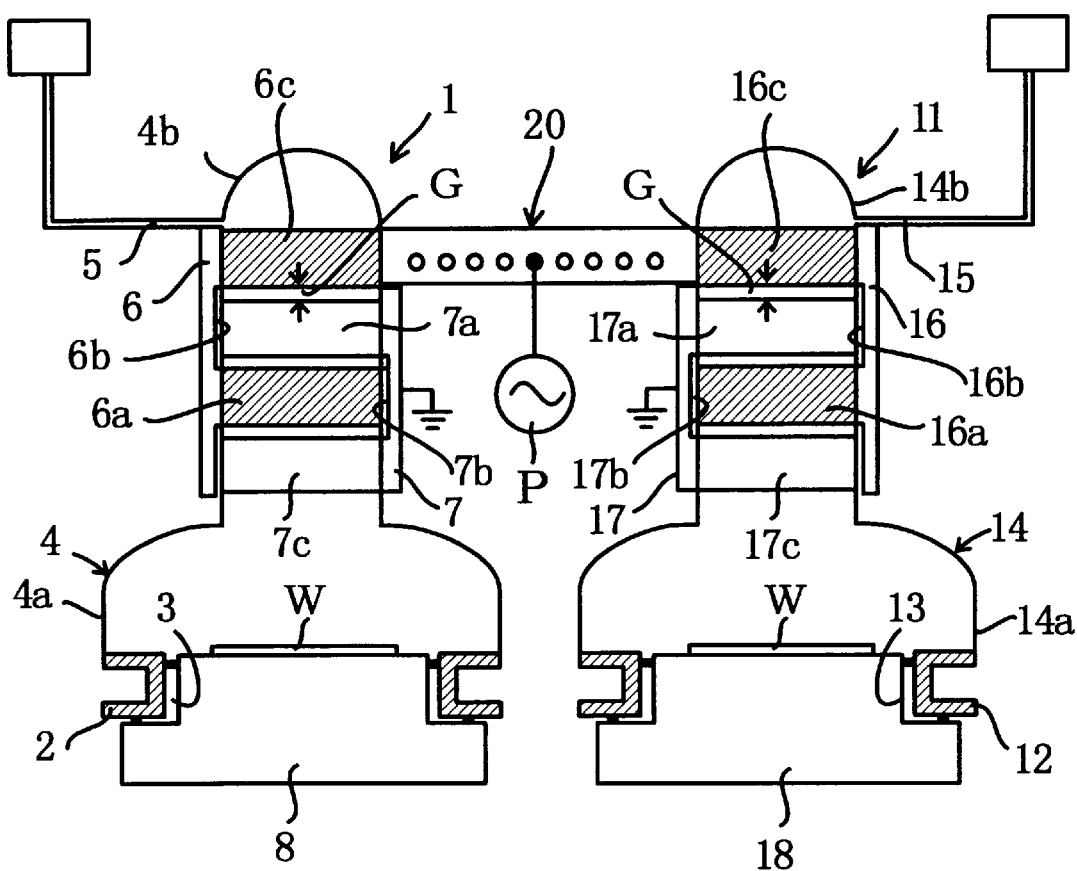
FIG. 1 is a cross-sectional view of a simultaneous discharge device according to a preferred embodiment of the present invention.

As shown in FIG. 1, the simultaneous discharge device has two plasma treating devices 1 and 11 which have the same structure. These plasma treating devices 1 and 11 form openings 3 and 13 around bases 2 and 12 and have chambers of quartz 4 and 14 covering these openings 3 and 13.

Chambers 4 and 14 comprise lower half parts 4*a*, 14*a* with a dome shape and upper half parts 4*b* and 14*b* with a cylindrical shape. At the upper half parts 4*b* and 14*b*, conduits for reaction gas 5 and 15 are provided, and on the outer periphery of the upper half parts 4*b* and 14*b*, the first plate-like electrodes 6 and 16, connected to a high-frequency power supply P, and the second plate-like electrodes 7 and 17, connected to ground, are disposed in opposite directions parting right and left on each axis of chambers 4 and 14, as shown in FIG. 1.

Since the first plate-like electrodes 6 and 16 and the second plate-like electrodes 7 and 17 comprise convex parts 6*a*, 16*a*, 7*a* and 17*a* and concave parts 6*b*, 16*b*, 7*b* and 17*b* which extend in the horizontal direction of the upper half parts 4*b* and 14*b*, they are shaped like the teeth of a comb. Further, the convex parts 6*a*, 16*a*, 7*a* and 17*a* engage with the concave parts 6*b*, 16*b*, 7*b* and 17*b* at a fixed interval G.

Accordingly, by keeping this interval G fixed in the horizontal and vertical directions, it is possible to generate plasma uniformly along the inner periphery of upper half parts 4*b* and 14*b*.

Further, as shown in FIG. 1, chambers 4 and 14 respectively form spaces for generating the plasma so as to treat wafers W, supported by tables 8 and 18.

Lower edge parts 7*c* and 17*c* of the second plate-like electrodes 7 and 17 surround chambers 4 and 14 at a position lower than the first plate-like electrodes 6 and 16, respectively. Accordingly, by surrounding the lowest edge of the space for generating plasma by the second plate-like electrodes 7 and 17 connected to ground, it is possible to prevent charged particles from moving toward wafer W.

On the other hand the tables 8 and 18 face the openings 3 and 13 of the bases 2 and 12 to support wafers W from below, and an exhaust (not shown) is formed in the bases 2 and 12, and connected to a vacuum pump (not shown).

Upper edge parts 6*c* and 16*c* of the first plate-like electrodes 6 and 16 and the high-frequency power supply P are connected together via electric power dividing means 20.

Electric power dividing means 20 is a member for supplying power uniformly from high-frequency power supply P to the two plasma treating devices 1, 11 by correcting any difference in impedance which may exist due to any differences in the arrangement of the first plate-like electrodes 6 and 16, the second plate-like electrodes 7 and 17, and so on.

Figure 2:
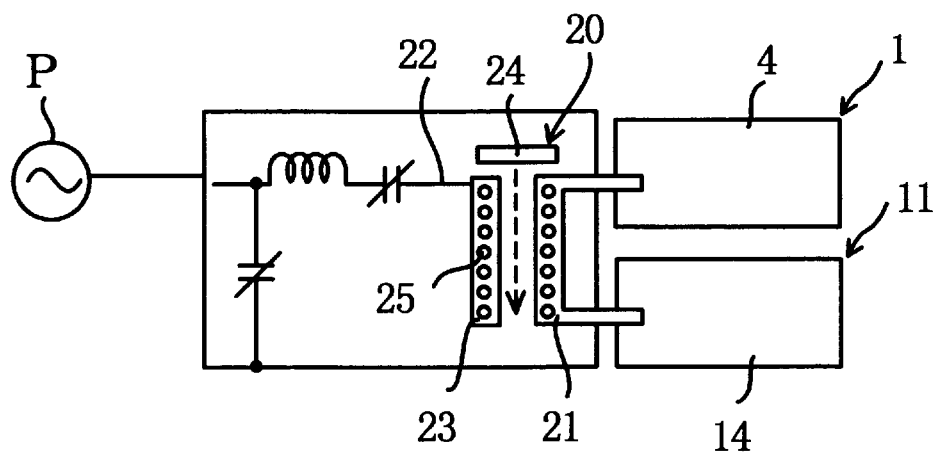
FIG. 2 is a perspective view for explaining a simultaneous discharge device according to the preferred embodiment of the present invention.

As shown in FIG. 2, electric power dividing means 20 comprises a copper plate 21 connected to upper edge parts 6c and 16c of the first plate-like electrodes 6 and 16, a copper plate 23 connected to a high-frequency power supply P through the ends of Rf cable 22, and a copper bar 24 which connects electrically the copper plates 21 and 23 at a plurality of positions. Convex parts (not shown) projecting in the same direction are formed at both ends of the copper bar 24.

Figure 3:
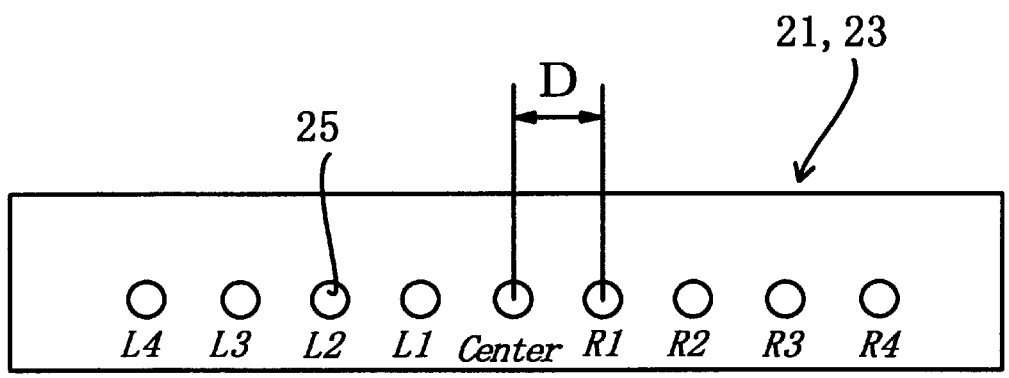
FIG. 3 is a plan view of a conductor plate.

As shown in FIG. 3, in both copper plates 21 and 23, nine connecting holes 25, one thereof located at the center, four (L1~L4) in the left side and four (R1~R4) in the right side, are formed at regular intervals D, wherein the convex parts of copper bar 24 fit into the connecting holes 25. It should be noted that, the number of connecting holes 25, shown as nine in FIG. 2, is not limited and the connecting holes 25 may be formed as one oblong hole as shown in FIG. 4.

As shown in FIGS. 2 and 3, copper plates 21 and 23 are preferably arranged to be connected electrically by fitting the convex parts of copper bar 24 into aligned pairs of the connecting holes 25 in the plates 21 and 23 corresponding thereto (for example, L2 of the plate 21 to L2 of the plate 23).

Namely, according to the selected connecting holes 25, in which the convex parts of copper bar 24 fit, that is, according to which of the nine holes is selected in each of the copper plates 21 and 23, the impedance between the high-frequency power supply P and each of the chambers 4 and 14 can be discretely and suitably adjusted so as to become equal.

Figure 4:
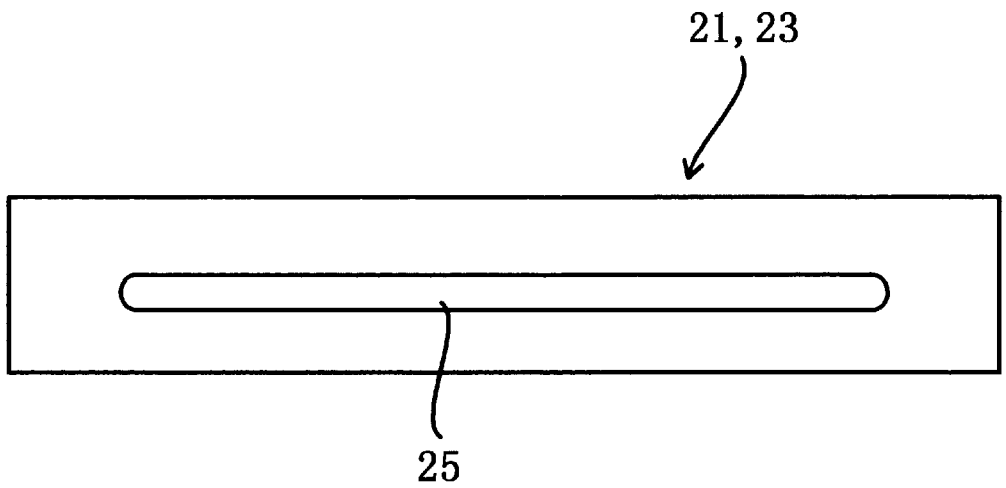
FIG. 4 is a plan view of a conductor plate according to another embodiment.
Figure 5:
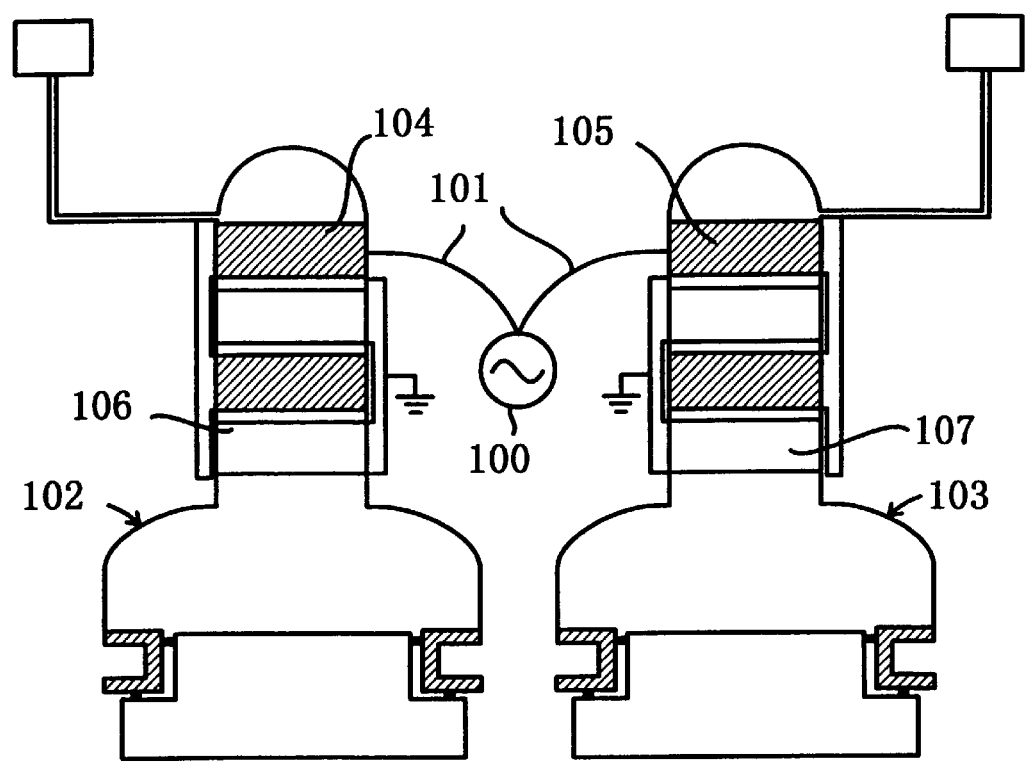
FIG. 5 is a cross-sectional view of the known simultaneous discharge device.

Further, is the case illustrated in FIG. 4 where the plural connecting holes 25 are formed as one oblong hole. According the positioning and location of the convex parts of the copper plates 24 in the oblong holes 25 in each of copper bar 21 and 23, the impedance between the high-frequency power supply P and each of the chambers 4 and 14 may, again, be continuously and suitably adjusted so as to become equal.

Thus, by suitably selecting various ones or portions of the connecting holes 25, into which convex parts of copper bar 24 are fitted, it is possible to supply the same power from one high-frequency power supply and create a discharge inside the two chambers 4 and 14 in the same manner simultaneously by making the impedance equal.

In use, after lowering the pressure inside of the chambers 4 and 14, introducing reaction gas from the reaction gas conduits 5 and 15 to the inside of chambers 4 and 14 and impressing or applying high-frequency power from the high-frequency power supply P to the first plate-like electrodes 6 and 16, plasma is generated uniformly in the inner periphery of the upper half parts 4b and 14b of the chambers 4, 14 along intervals G between convex parts 6a, 16a, 7a and 17a of the first and second plate-like electrodes and concave parts 6b, 16b, 7b and 17b thereof.

Accordingly, it is possible to simultaneously treat the wafers W at the same rate in each of the chambers 4 and 14. Although there have been described what are at present considered to be preferred embodiments of the invention, it will be understood by those skilled in the art that variations and modifications may be made thereto without departing from the spirit or essence of the invention. For example, in the depicted embodiments, according to the arrangement of the copper plates 21 and 23 electrically connected by fitting the copper bar 24 into any aligned pair of the connecting holes 25, the impedance between the high-frequency power source and each of the chambers 4 and 14 can be discretely and suitably adjusted so as to become equal. However, it is possible that the difference in impedance between chambers may be sensed with power monitors, feedback performed and the connecting position automatically changed. In this case, both ends of the respective plate-like electrodes 6 and 7, tables 8 and 18 or the like can be assumed as the position in which the power monitors are disposed. Correspondingly, the scope of the invention is indicated by the appended claims, rather than by the foregoing discussion of the preferred embodiments.

What is claimed is:

1. A simultaneous discharge device comprising:
   a high-frequency power supply;
   two plasma treating devices, each one having a chamber in which plasma discharge is simultaneously generated by said high-frequency power supply for treating semiconductor wafers; and
   electric power dividing means for connecting said high-frequency power supply to said chambers;
   said electric dividing means comprising a first elongate conductor plate connected to each of said chambers, a second elongate conductor plate connected to said high-frequency power supply, and a conductor bar interconnecting said elongate conductor plates at various positions therealong so that an impedance between the power supply and each of the chambers becomes equal.

2. A device according to claim 1, wherein
   a plurality of holes are formed in said first conductor plate;
   a plurality of holes are formed in said second conductor plate; and
   said conductor bar comprises two convex parts projecting parallel with each other, wherein
   each of said convex parts of said conductor bar may be fitted into different ones of said plural holes of said first and second conductor plates for varying impedance between said power supply and said chambers.

3. A device according to claim 2, wherein said first and second conductor plates have 9 holes formed therein.

4. A device according to claim 2, wherein said holes are circular.

5. A device according to claim 1, wherein
   an oblong hole is defined in said first conductor plate;
   an oblong hole is defined in said second conductor plate; and
   said conductor bar comprises two convex parts projecting parallel with each other, and each of said convex parts may be fitted into different portions of said oblong holes in said first and second conductor plates for varying impedance between said power supply and said chambers.

6. A device according to claim 1, wherein each of said chambers has a plurality of plate-like electrodes provided thereon, an uppermost one of the plate-like electrodes on each said chamber being connected to said high frequency power supply through said electric power dividing means.

7. A method for creating a simultaneous discharge in two plasma treating devices, each one having a chamber wherein simultaneous discharge is generated inside the chambers of said devices simultaneously with one high-frequency power supply, the method comprising the steps of:
   connecting said chambers to a first elongate conductor plate;

connecting said high-frequency power supply to a second elongate conductor plate; and interconnecting said first and second conductor plates by connecting projecting parts of a conductor bar to various portions of said first and second conductor plates so that an impedance between the high-frequency power supply and each of said chambers becomes equal.

8. A method according to claim 7, in which each of said first and second conductor plates has a single oblong hole formed therein, and said interconnecting step comprises the step of suitably inserting said projecting parts of said conductor bar into portions of each said oblong hole in said first and second conductor plates, respectively, so that the impedance between the power supply and each of said two chambers becomes equal.

9. A method according to claim 7, wherein each of said first and second conductor plates has a plurality of holes formed therein, and said interconnecting step involves suitably inserting said projecting parts of said conductor bar into different ones of said holes in said first and second conductor plates so that the impedance between the power supply and each of said chambers becomes equal.

10. A method according to claim 9, wherein said first and second conductor plates are disposed in alignment with each other such that the holes formed in the first conductor plate align with the holes formed in the second conductor plate; and said interconnecting step involves suitably inserting said projecting parts of said conductor bar into an aligned pair of said holes in said first and second conductor plates.

11. A simultaneous discharge device comprising:

a high-frequency power supply;

two plasma treating devices, each one having a chamber in which plasma discharge is simultaneously generated by said high-frequency power supply for treating semiconductor wafers;

electric power dividing means for connecting said high-frequency power supply to said chambers; and said electric power dividing means comprising means for adjusting an impedance between said power supply and one said chamber to be equal to an impedance between the power supply and the other said chamber.

12. A device according to claim 11, wherein said adjusting means permits the impedance between the power supply and each said chamber to be independently adjusted.

13. A device according to claim 11, wherein said adjusting means comprises a first elongate conductor plate connected to each of said two chambers, a second elongate conductor plate connected to said high-frequency power supply, and a conductor bar interconnecting said elongate conductor plates at various positions therealong so that an impedance between the power supply and each of the chambers becomes equal.

* * * * *

UNITED STATES PATENT AND TRADEMARK OFFICE
CERTIFICATE OF CORRECTION

PATENT NO  :  5,922,134
DATED      :  13 July 1999
INVENTOR(S):  Kazuto Ohbuchi

It is certified that error appears in the above-identified patent and that said Letters Patent are hereby corrected as shown below:

Column 2, line 58, after "On the other hand" insert a comma.

Column 3, lines 1-2, change "differences" to --difference(s)--;
        line numbered between 35 and 36, before "the positioning" insert --to--;
        line 60, begin a new paragraph with "Although".

Column 4, line 22 (claim 1, line 9), after "electric" insert --power--.

Signed and Sealed this

Twenty-second Day of May, 2001

Attest:

NICHOLAS P. GODICI

Attesting Officer        Acting Director of the United States Patent and Trademark Office